United States Patent
Ida et al.

[11] Patent Number: 6,061,218
[45] Date of Patent: May 9, 2000

[54] OVERVOLTAGE PROTECTION DEVICE AND METHOD FOR INCREASING SHUNT CURRENT

[75] Inventors: Richard T. Ida, Phoenix, Ariz.; Daniel L. Ziegler; Robert O. Wagner, both of Austin, Tex.

[73] Assignee: Motorola, Inc., Schaumburg, Ill.

[21] Appl. No.: 08/943,325

[22] Filed: Oct. 3, 1997

[51] Int. Cl.[7] .................................................. H02H 9/00
[52] U.S. Cl. ........................ 361/56; 361/58; 361/111; 361/118
[58] Field of Search .................. 361/56, 58, 111, 361/118, 119, 91.1, 100

[56] References Cited

U.S. PATENT DOCUMENTS

| | | | |
|---|---|---|---|
| 5,010,380 | 4/1991 | Avery | 357/23.13 |
| 5,155,398 | 10/1992 | Mikuni et al. | 307/571 |
| 5,506,742 | 4/1996 | Marum | 361/56 |
| 5,576,557 | 11/1996 | Ker et al. | 257/173 |
| 5,600,525 | 2/1997 | Avery | 361/56 |
| 5,615,074 | 3/1997 | Avery | 361/56 |

*Primary Examiner*—Stephen W. Jackson
*Attorney, Agent, or Firm*—Anthony M. Martinez

[57] ABSTRACT

An overvoltage protection device (40) and a method for increasing the overvoltage current the device can carry. The overvoltage protection device (40) includes a Silicon Controlled Rectifier (SCR) (11) and an SCR enhance circuit (42). The SCR enhance circuit (42) provides the SCR (11) with an additional low resistance path to increase the amount of overvoltage shunt current the SCR (11) carries during an overvoltage event.

17 Claims, 3 Drawing Sheets

OVERVOLTAGE PROTECTION DEVICE AND METHOD FOR INCREASING SHUNT CURRENT

BACKGROUND OF THE INVENTION

The present invention relates, in general, to high voltage protection circuitry and, more particularly, to Electrostatic Discharge (ESD) protection circuitry.

It is well known that monolithic integrated circuits may become damaged by exposing their input or output terminals to large and sudden voltage transients such as electrostatic discharges. For example, electrostatic charge may build up on personnel and test equipment. When the charged person or piece of test equipment contacts the input or output terminals of the integrated circuit, the built-up electrostatic charge discharges and may force large currents into the integrated devices. The large currents may rupture dielectric materials within the integrated devices such as gate oxides or they may melt conductive materials such as polysilicon or aluminum interconnects, thereby irreparably damaging the integrated circuits.

Generally, integrated circuit manufacturers include protection devices that shunt current away from input and output circuitry within integrated devices to prevent the integrated devices from being damaged by large voltage transients. One technique for protecting integrated device input and output circuitry is to form current shunting structures from parasitic elements present in the integrated devices. A disadvantage of this technique is that the breakdown voltage of these structures is limited by the processing techniques for manufacturing the integrated circuit. Another technique for protecting these circuits is to improve the energy dissipation capability of the protection circuitry. This is done by laying out the protection circuit to have larger geometries, wider metal interconnects, more and larger contacts, etc. A disadvantage of this approach is it increases the size of the integrated device and thus decreases the number of integrated circuits per semiconductor wafer, thereby increasing the cost of manufacturing the integrated circuits.

Accordingly, it would be advantageous to have an integrated device for protecting an integrated circuit from large voltage transients and a method of manufacturing the integrated device. It would be of further advantage for the integrated device to occupy a small area and be capable of protecting integrated circuit input and output structures.

DETAILED DESCRIPTION OF THE DRAWINGS

Generally, the present invention provides an overvoltage protection device and a method for increasing a shunt current therein. In accordance with the present invention, a current shunt element is coupled to a Silicon Controlled Rectifier (SCR) to form an improved overvoltage protection device. The improved device is capable of conducting a larger current than a typical SCR. Further, the overvoltage protection device of the present invention occupies less area than the typical SCR.

Figure 1:
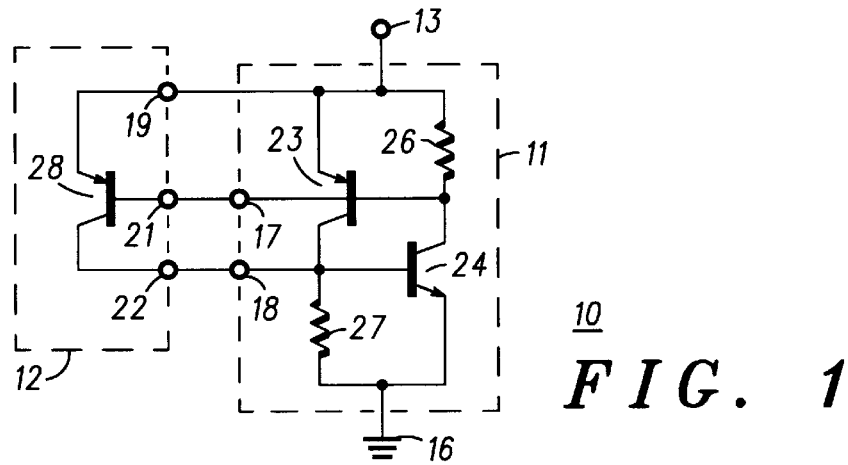
FIG. 1 is a schematic diagram of an overvoltage protection device in accordance with a first embodiment of the present invention.

FIG. 1 is a schematic diagram of an overvoltage protection device 10 in accordance with a first embodiment of the present invention. Overvoltage protection device 10 includes a Silicon Controlled Rectifier (SCR) 11 connected to an SCR enhance circuit 12. SCR 11 has an anode 13, a cathode 16, an output 17, and an input 18. Preferably, anode 13 is coupled for receiving an input signal and cathode 16 is coupled for receiving a power supply voltage such as, for example, ground. SCR enhance circuit 12 has an input 19 connected to anode 13, an input 21 connected to SCR output 17, and an output 22 connected to SCR input 18.

SCR 11 is comprised of transistors 23 and 24 and resistors 26 and 27. By way of example, transistor 23 is a PNP bipolar transistor and transistor 24 is an NPN bipolar transistor. PNP bipolar transistor 23 has an emitter connected to anode 13, a base connected to SCR output 17, and a collector connected to SCR input 18. NPN bipolar transistor 24 has a collector connected to the base of PNP bipolar transistor 23, a base connected to SCR input 18, and an emitter connected to cathode 16. Resistor 26 has a first terminal connected to anode 13 and a second terminal connected to the base of PNP bipolar transistor 23. Resistor 27 has a first terminal connected to SCR input 18 and a second terminal connected to cathode 16.

SCR enhance circuit 12 is, for example, a PNP bipolar transistor 28 having an emitter connected to input 19, a base connected to input 21, and a collector connected to output 22. Preferably, the current gain ($\beta_{28}$) of PNP bipolar transistor 28 is greater than the current gain ($\beta_{23}$) of PNP bipolar transistor 23. It should be noted that the base of a bipolar transistor is referred to as the control electrode and the collector and emitter are referred to as current carrying electrodes. It should also be noted that a transistor is also referred to as an active device.

Under normal operating conditions, i.e., in the absence of an Electrostatic Discharge (ESD) event, SCR 11 and SCR enhance circuit 12 are off and SCR 11 behaves as an open circuit between anode 13 and cathode 16. In other words, SCR 11 and SCR enhance circuit 12 are in a high impedance mode of operation and only conduct leakage currents that are in the nano-ampere range. When the voltage at anode 13 exceeds a trigger or turn on voltage of SCR 11, SCR 11 turns on and conducts a current in excess of one ampere.

More particularly, when the voltage at anode 13 exceeds a breakdown voltage of the N-P junction formed by the base and collector of PNP bipolar transistor 23 and the collector and base of NPN bipolar transistor 24, transistors 23 and 24 turn on and provide forward bias currents to each other. Thus, when transistors 23 and 24 turn on, SCR 11 turns on and enters a low impedance mode of operation, wherein the voltage between anode 13 and cathode 16 is reduced to a value less than the breakdown voltage. In addition, when SCR 11 turns on, PNP bipolar transistor 28 turns on due to the forward bias current from NPN bipolar transistor 24. Thus, PNP bipolar transistor 28 provides additional shunt current during an ESD event. Accordingly, when an ESD event occurs, transistors 23, 24, and 28 cooperate to provide three low resistance paths between an input pad (not shown) coupled to anode 13 and cathode 16. Current is conducted through the three low resistance paths, thereby dissipating charge appearing at the input pad due to the ESD event.

Figure 2:
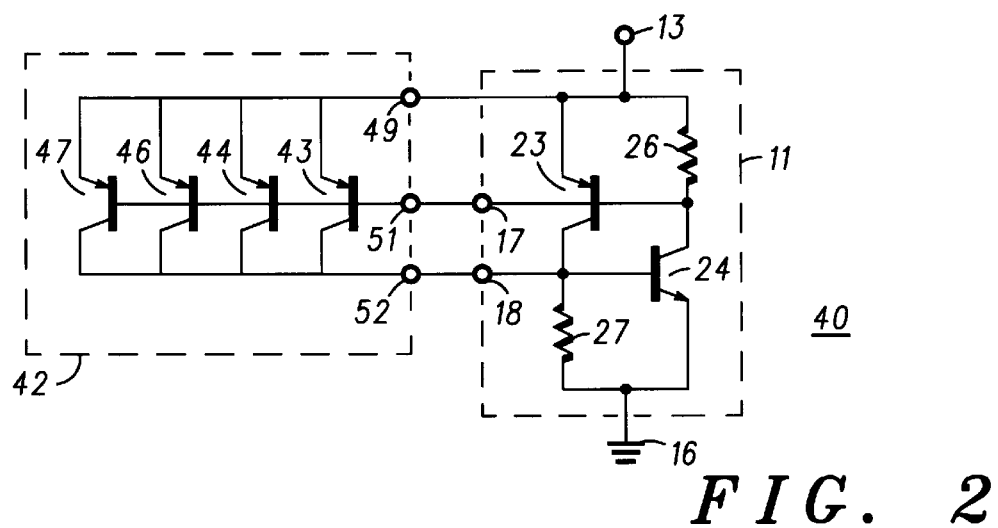
FIG. 2 is a schematic diagram of an overvoltage protection device in accordance with a second embodiment of the present invention.

FIG. 2 is a schematic diagram of an overvoltage protection device 40 in accordance with a second embodiment of the present invention. It should be understood that the same reference numerals are used in the figures to denote the same elements. Overvoltage protection device 40 includes SCR 11 connected to an SCR enhance circuit 42. SCR enhance circuit 42 has an input 49 connected to anode 13, an input 51 connected to SCR output 17, and an output 52 connected to SCR input 18. SCR enhance circuit 42 includes PNP bipolar transistors 43, 44, 46, and 47. Transistors 43, 44, 46, and 47 each have a base commonly connected to input 51, an emitter commonly connected to input 49, and a collector commonly connected to output 52. The difference between overvoltage protection device 40 of FIG. 2 and overvoltage protection device 10 of FIG. 1 is that SCR enhance circuit 42 includes a plurality of transistors whereas SCR enhance circuit 12 is comprised of a single transistor.

Figure 3:
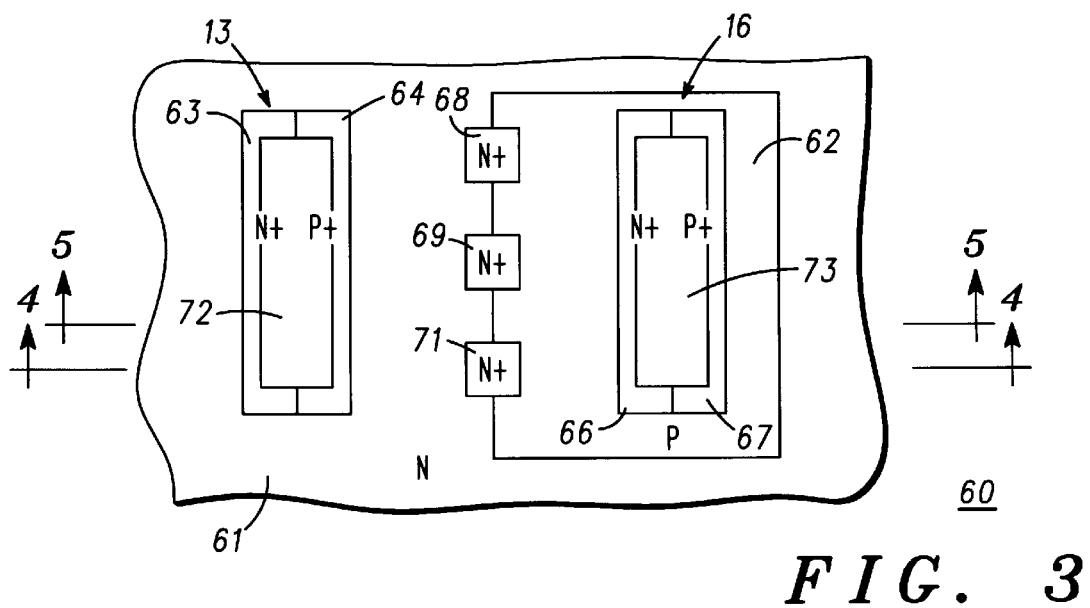
FIG. 3 is a top view of a layout of the overvoltage protection device of FIG. 2.

FIG. 3 is a top view of a layout 60 of overvoltage protection device 40. Layout 60 illustrates anode 13, cathode 16, and a semiconductor material 61 containing a plurality of doped regions. By way of example, semiconductor material 61 is lightly doped with an impurity material of N conductivity type and has a concentration ranging between approximately $10^{14}$ atoms per cubic centimeter (atoms/cm$^3$) and approximately $10^{16}$ atoms/cm$^3$. A doped region 62 of P conductivity type is formed in semiconductor material 61. Doped region 62 is also referred to as a well or a well region.

A heavily doped region 66 of N conductivity type is formed in well 62. Doped region 66 has a dopant concentration ranging between approximately $10^{18}$ atoms/cm$^3$ and approximately $10^{20}$ atoms/cm$^3$. In addition, a heavily doped region 67 of P conductivity type is formed in well 62. Doped region 67 has a dopant concentration ranging between approximately $10^{18}$ atoms/cm$^3$ and approximately $10^{20}$ atoms/cm$^3$. Although doped regions 66 and 67 are shown as abutting each other, it should be understood this is not a limitation of the present invention. For example, doped regions 66 and 67 may be spaced apart.

A plurality of heavily doped regions of N conductivity type 68, 69, and 71 are formed overlying a boundary between well 62 and semiconductor material 61. In other words, doped regions 68, 69, and 71 overlap well 62 and semiconductor material 61. Although regions 68, 69, and 71 are shown as overlapping well 62 and semiconductor material 61, this is not a limitation of the present invention. For example, regions 68, 69, and 71 may formed in well 62 and contact semiconductor material 61. Similarly, regions 68, 69, and 71 may formed in semiconductor material 61 and contact well 62. Doped regions 68, 69, and 71 have a dopant concentration ranging between approximately $10^{18}$ atoms/cm$^3$ and approximately $10^{20}$ atoms/cm$^3$. It should be noted that the number of doped regions overlapping the boundary between doped region 62 and semiconductor material 61 is not a limitation of the present invention.

A heavily doped region 64 of P conductivity type is formed in semiconductor material 61. Doped region 64 is spaced apart from well 62. Doped region 64 has a dopant concentration ranging between approximately $10^{18}$ atoms/cm$^3$ and approximately $10^{20}$ atoms/cm$^3$. A heavily doped region 63 of N conductivity type is formed in semiconductor material 61. Doped region 63 has a dopant concentration ranging between approximately $10^{18}$ atoms/cm$^3$ and approximately $10^{20}$ atoms/cm$^3$. Although doped regions 63 and 64 are shown as abutting each other, it should be understood this is not a limitation of the present invention. For example, doped regions 63 and 64 may be spaced apart.

Doped regions 63, 66, 68, 69, and 71 may be formed in a single doping step. Likewise, doped regions 64 and 67 may be formed in a single doping step. Techniques for forming well regions and doped regions within a semiconductor material are well known to those skilled in the art.

Anode metal 72 overlaps regions 63 and 64 and cathode metal 73 overlaps regions 66 and 67. Anode metal 72 and regions 63 and 64 cooperate to form anode 13. Cathode metal 73 and regions 66 and 67 cooperate to form cathode 16.

Figure 4:
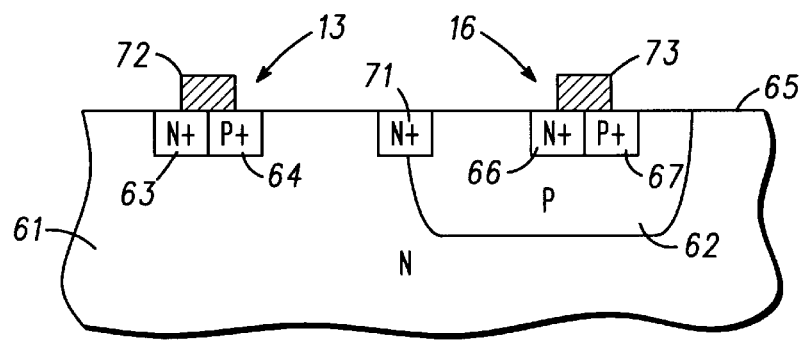
FIG. 4 is a cross-sectional view of the overvoltage protection device of FIG. 3 taken along section line 4—4.

FIG. 4 is a cross-sectional view of overvoltage protection device 40 taken along section line 4—4 of FIG. 3. It should be understood that the same reference numerals are used in the figures to denote the same elements. What is shown in FIG. 4 is semiconductor material 61 having a major surface 65. Well 62 extends vertically from major surface 65 into semiconductor material 61 a first depth. Well 62 may be formed by implanting a dopant or impurity material of P conductivity type such as, for example, boron. Alternatively, well 62 may be formed by diffusing the P type impurity material into semiconductor material 61. By way of example, well 62 has a junction depth ranging between approximately 0.5 micrometers ($\mu$m) and approximately 10 $\mu$m and a surface concentration of P type impurity material ranging between approximately $10^{16}$ atoms/cm$^3$ and approximately $10^{17}$ atoms/cm$^3$.

Doped regions 66 and 67 extend vertically from surface 65 into well 62 a second depth, wherein the second depth is less than the first depth. By way of example, doped regions 66 and 67 have junction depths ranging between approximately 0.2 $\mu$m and approximately 0.6 $\mu$m. Further, doped region 66 has a surface concentration ranging between approximately $10^{18}$ atoms/cm$^3$ and approximately $10^{20}$ atoms/cm$^3$. Region 67 has a surface concentration ranging between approximately $10^{18}$ atoms/cm$^3$ and approximately $10^{20}$ atoms/cm$^3$.

Doped region 71 extends vertically from major surface 65 into a portion of semiconductor material 61 and a portion of well 62. By way of example, doped region 71 has a junction depth ranging between approximately 0.2 $\mu$m and approximately 0.6 $\mu$m.

Doped regions 63 and 64 extend vertically from major surface 65 into semiconductor material 61. By way of example, doped regions 63 and 64 have junction depths ranging between approximately 0.2 $\mu$m and approximately 0.6 $\mu$m.

Figure 5:
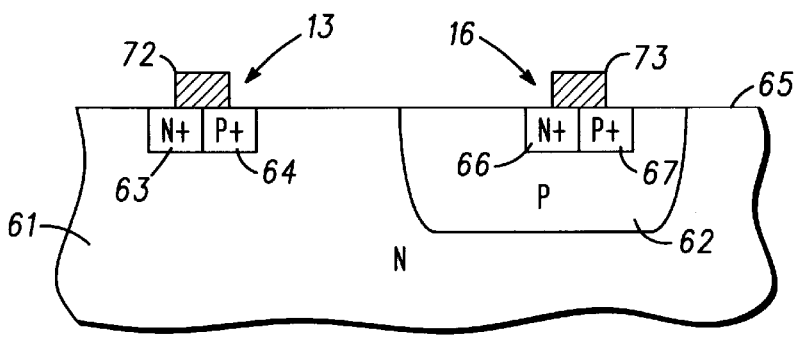
FIG. 5 is a cross-sectional view of the overvoltage protection device of FIG. 3 taken along section line 5—5.

FIG. 5 is a cross-sectional view of overvoltage protection device 40 taken along section line 5—5 of FIG. 3. It should be understood that the cross-sectional view of FIG. 5 is taken along a different portion of device 40 than the cross-sectional view taken along section line 4—4 and that the difference between the cross-sectional views of FIGS. 4 and 5 is that doped region 71 is not shown in the view of FIG. 5.

Referring to FIGS. 2 and 4, PNP bipolar transistor 23 is formed in the portion of semiconductor material 61 along section line 4—4. The emitter of transistor 23 is region 64, the base of transistor 23 is formed by semiconductor material 61 and region 71, and the collector of transistor 23 is region 62. The emitter of transistor 24 is region 66, the base of transistor 24 is region 62, and the collector of transistor 24 is semiconductor material 61. Resistor 26 is formed by a parasitic resistance of semiconductor material 61 and an ohmic contact with region 63. Resistor 27 is formed by a parasitic resistance of region 62 and an ohmic contact with region 67. Although SCR 11 is described as including resistors 26 and 27, this is not a limitation of the present invention. SCR 11 may be fabricated without resistors 26 and 27. Likewise, SCR 11 may be fabricated without regions 63 and 67.

PNP bipolar transistors 44 and 47 are formed from portions of semiconductor material 61 that are parallel to section line 4—4 and through regions 69 and 68 (FIG. 3). The emitter of transistor 44 is region 64, the base of transistor 44 is formed by semiconductor 61 and region 69, and the collector of transistor 44 is region 62. The emitter of transistor 47 is region 64, the base of transistor 44 is formed by semiconductor material 61 and region 68, and the collector of transistor 44 is region 62.

Referring to FIGS. 2 and 5, PNP bipolar transistor 43 is formed in the portion of semiconductor material 61 along section line 5—5. The emitter of transistor 43 is region 64, the base of transistor 43 is semiconductor material 61, and the collector of transistor 43 is region 62.

PNP bipolar transistor 46 is formed from a portion of semiconductor material 61 parallel to section line 5—5 and through the space between regions 69 and 68. By way of example, the emitter of transistor 46 is region 64, the base of transistor 46 is semiconductor 61, and the collector of transistor 46 is region 62.

Because region 71 (FIG. 4) is heavily doped, the breakdown voltage across the junction between the base and collector of PNP bipolar transistor 23 (FIG. 2) is lower than the breakdown voltage of the junction between the base and collector of PNP bipolar transistor 43. In addition, because of the presence of region 71, the current gain of PNP bipolar transistor 23 is lower than the current gain of PNP bipolar transistor 43. It should be noted that PNP bipolar transistor 46 has substantially the same characteristics for current gain and breakdown voltage as PNP bipolar transistor 43. It should also be noted that PNP bipolar transistors 44 and 47 have substantially the same characteristics for current gain and breakdown voltage as PNP bipolar transistor 23. Therefore, the current gain and breakdown voltage of PNP bipolar transistors 43 and 46 are higher than the current gain and breakdown voltage of PNP bipolar transistors 23, 44, and 47.

Referring to FIG. 2, under normal operating conditions, i.e., in the absence of an ESD event, SCR 11 and SCR enhance circuit 42 are off. SCR 11 turns on when the voltage at anode 13 exceeds a trigger voltage of SCR 11. More particularly, SCR 11 turns on when the voltage at anode 13 exceeds the breakdown voltage of the N-P junction between the base and collector of PNP bipolar transistor 23 and the N-P junction between the collector and base of NPN bipolar transistor 24. Similarly, PNP bipolar transistors 44 and 47 turn on when the voltage at anode 13 exceeds the breakdown voltage of the N-P junctions between the base and collector of transistors 44 and 47. When transistors 23, 24, 44, and 47 turn on, they provide forward bias currents to each other. In addition, PNP bipolar transistors 43 and 46 turn on due to the forward bias current from NPN bipolar transistor 24. Accordingly, when an ESD event occurs, transistors 23, 24, 43, 44, 46, and 47 provide six low resistance paths between anode 13 and cathode 16 through which current is conducted to dissipate charge at anode 13. Furthermore, when an ESD event occurs, power dissipation is distributed through the six low resistance paths. Thus, the spacing of regions 68, 69, and 71 results in overvoltage protection device 60 (FIG. 3) having a higher shunt current than an overvoltage device formed from a single region overlapping semiconductor material 61 and well 62.

Figure 6:
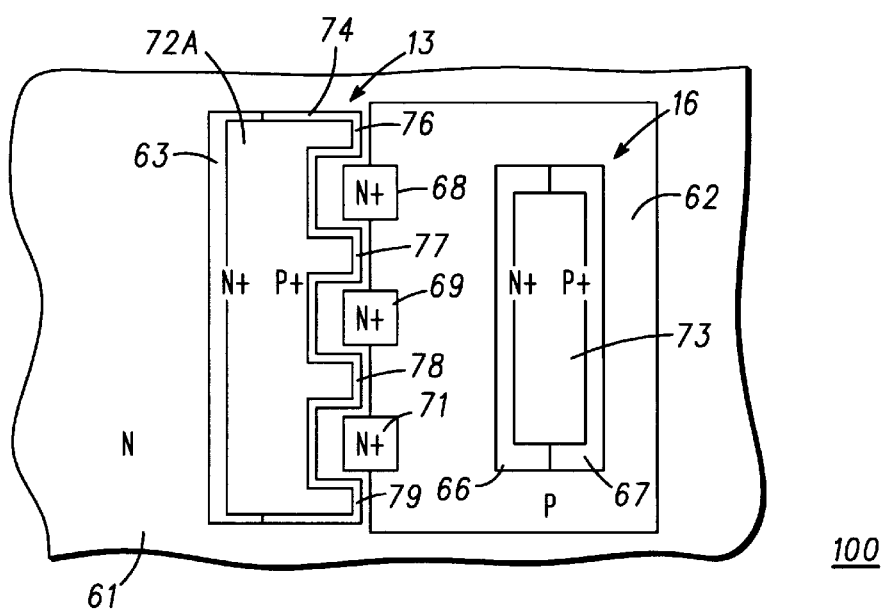
FIG. 6 is a top view of a layout of an overvoltage protection device in accordance with a third embodiment of the present invention.

FIG. 6 is a top view of a layout 100 of an overvoltage protection device in accordance with a third embodiment of the present invention. It should be understood that the same reference numerals are used in the figures to denote the same elements. Layout 100 is similar to layout 60 of FIG. 3 except that region 74 has a different shape than region 64. Region 74 is spaced apart from regions 62, 68, 69, and 71 and shaped to have a serrated structure, i.e., a plurality of extensions or fingers 76, 77, 78, and 79. Fingers 77 and 78 extend into the spaces between regions 68, 69, and 71.

Anode metal 72A overlaps regions 63 and 74 and cathode metal 73 overlaps regions 66 and 67. Anode metal 72A and regions 63 and 64 cooperate to form anode 13. Cathode metal 73 and regions 66 and 67 cooperate to form cathode 16.

Because of the shape of region 74, the base width is minimized for a PNP bipolar transistor formed from region 74, semiconductor material 61, and well 62 and along a line crossing finger 78 between regions 69 and 71. Thus, the PNP bipolar transistor formed along the line crossing finger 78 between regions 69 and 71 has a higher current gain than an analogous PNP bipolar transistor formed along section line 5—5 of FIG. 3. Similarly, PNP bipolar transistors formed along lines crossing fingers 76, 77, and 79 and parallel to the line crossing finger 78 between regions 69 and 71 have higher current gains than an analogous PNP bipolar transistor formed along section line 5—5 of FIG. 3. By minimizing the base width of the PNP bipolar transistors formed along lines crossing fingers 76, 77, 78, and 79 described hereinbefore, the amount of overvoltage current that can be shunted by overvoltage protection device 100 is enhanced. It should be noted that one representation of an equivalent circuit for layout 100 is the circuit diagram of FIG. 2. Although SCR enhance circuit 42 (FIG. 2) is shown as having four PNP bipolar transistors for one representation of an equivalent circuit for layout 100, this is not a limitation of the present invention. Another representation of an equivalent circuit for layout 100 may include SCR enhance circuit 42 having six bipolar PNP transistors in parallel instead of the four shown. The two additional PNP bipolar transistors may be formed from lines crossing fingers 76 and 79.

Figure 7:
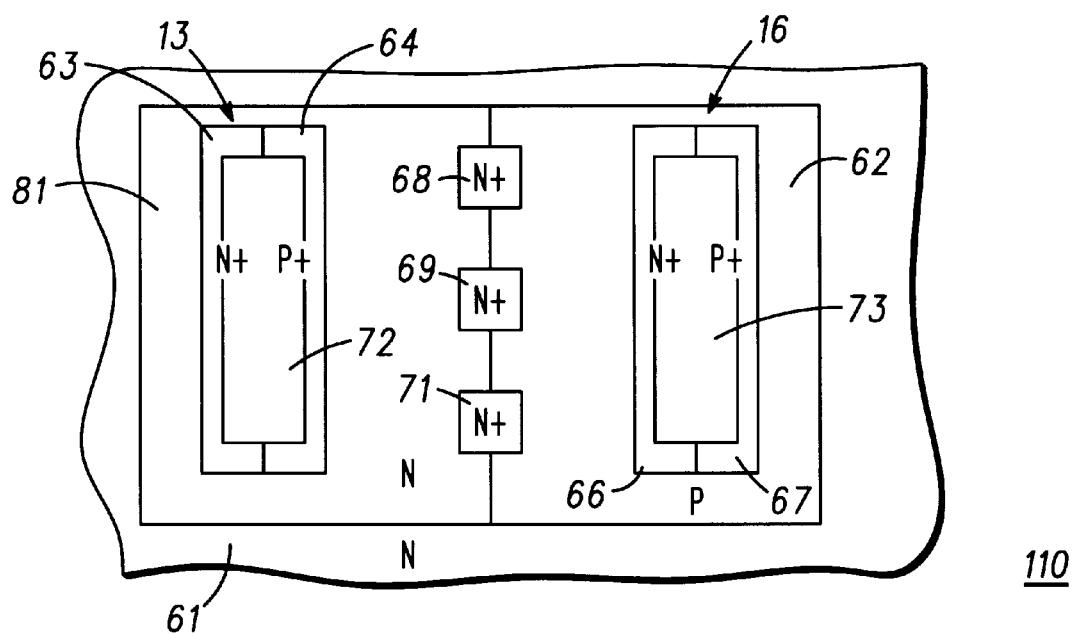
FIG. 7 is a top view of a layout of an overvoltage protection device in accordance with a fourth embodiment of the present invention.

FIG. 7 is a top view of a layout 110 of an overvoltage protection device in accordance with a fourth embodiment of the present invention. Layout 110 is similar to layout 60 of FIG. 3 except that layout 110 has a doped region 81. More particularly, doped region 81 is lightly doped with an impurity material of N conductivity type and is formed in semiconductor material 61. Doped region 81 is also referred to as a well or well region. By way of example, well 81 has a junction depth ranging between approximately 0.5 $\mu$m and approximately 10 $\mu$m and a dopant concentration of N type impurity material ranging between approximately $10^{17}$ atoms/cm$^3$ and approximately $10^{18}$ atoms/cm$^3$. Doped regions 63 and 64 are formed in well 81. Doped regions 68, 69, and 71 are formed overlying a boundary between well 81 and well 62. Layout 110 is an example of an overvoltage protection device formed using a twin well process.

By now it should be appreciated that an overvoltage protection device has been provided that prevents overvoltage damage when an overvoltage event is applied to a pad of an integrated circuit. An advantage of the present invention is that it provides a circuit and method that are both area and cost efficient. Another advantage of the present invention is that it also provides a device with a higher shunt current than a typical SCR.

What is claimed is:

1. An overvoltage protection device, comprising:
    a Silicon Controlled Rectifier (SCR) having an anode, a cathode, an input, and an output, wherein the SCR comprises:
        a first transistor having a control electrode coupled to the output of the SCR, a first current carrying electrode coupled to the anode of the SCR, and a second current carrying electrode coupled to the input of the SCR; and
        a second transistor having a control electrode coupled to the input of the SCR, a first current carrying electrode coupled to the control electrode of the first transistor, and a second current carrying electrode coupled to the cathode of the SCR;
    an SCR enhance circuit having a first input coupled to the anode of the SCR, a second input coupled to the output of the SCR, and an output coupled to the input of the SCR,
    wherein the SCR enhance circuit comprises:
        a third transistor having a control electrode coupled to the second input of the SCR enhance circuit, a first current carrying electrode coupled to the first input of the SCR enhance circuit, and a second current carrying electrode coupled to the output of the SCR enhance circuit, wherein a current gain of the third transistor is greater than a current gain of the first transistor.

2. The overvoltage protection device of claim 1, wherein the first and third transistors are PNP bipolar transistors and the second transistor is an NPN bipolar transistor.

3. The overvoltage protection device of claim 1, wherein a breakdown voltage between the control and first current carrying electrodes of the third transistor is greater than a breakdown voltage between the control and first current carrying electrodes of the first transistor.

4. The overvoltage protection device of claim 1, wherein the SCR enhance circuit further comprises:
    a fourth transistor having a control electrode coupled to the second input of the SCR enhance circuit, a first current carrying electrode coupled to the first input of the SCR enhance circuit, and a second current carrying electrode coupled to the output of the SCR enhance circuit;
    a fifth transistor having a control electrode coupled to the second input of the SCR enhance circuit, a first current carrying electrode coupled to the first input of the SCR enhance circuit, and a second current carrying electrode coupled to the output of the SCR enhance circuit; and
    a sixth transistor having a control electrode coupled to the second input of the SCR enhance circuit, a first current carrying electrode coupled to the first input of the SCR enhance circuit, and a second current carrying electrode coupled to the output of the SCR enhance circuit.

5. The overvoltage protection device of claim 4, wherein the control electrode of the first transistor is coupled to the anode of the SCR via a first resistor and the control electrode of the second transistor is coupled to the cathode of the SCR via a second resistor.

6. The overvoltage protection device of claim 4, wherein the second transistor is an NPN bipolar transistor and the first, third, fourth, fifth, and sixth transistors are PNP bipolar transistors.

7. The overvoltage protection device of claim 4, wherein the current gain of third transistor is substantially equal to a current gain of the fifth transistor and wherein the current gain of the first transistor, a current gain of the fourth transistor, and a current gain of the sixth transistor are substantially equal to each other.

8. An overvoltage protection device, comprising:
    a semiconductor material of a first conductivity type having a surface;
    a well region of a second conductivity type extending from the surface into the semiconductor material;
    a first doped region of the second conductivity type within the semiconductor material and spaced apart from the well region;
    a second doped region of the first conductivity type within the well region;
    a third doped region of the first conductivity type contacting the well region and the semiconductor material; and
    a fourth doped region of the first conductivity type contacting the well region and the semiconductor material, spaced apart from the third doped region, and between the first doped region and the second doped region.

9. The overvoltage protection device of claim 8, wherein the overvoltage protection device further comprises:
    a fifth doped region of the first conductivity type within the semiconductor material and adjacent to the first doped region; and
    a sixth doped region of the second conductivity type within the well region and adjacent to the second doped region.

10. The overvoltage protection device of claim 9, wherein the concentration of impurity material of the well region and the semiconductor material is lower than the concentration of impurity material of the first doped region, the second doped region, the third doped region, the fourth doped region, the fifth doped region, and the sixth doped region.

11. The overvoltage protection device of claim 9, wherein the well region extends into the semiconductor material from the surface a first depth, the first doped region and the fifth doped region extend into the semiconductor material from the surface a second depth, the second doped region and the sixth doped region extend into the well region from the surface the second depth, and the third doped region and the fourth doped region extend into the well region and the semiconductor material from the surface the second depth.

12. The overvoltage protection device of claim 11, wherein the second depth is less than the first depth.

13. The overvoltage protection device of claim 9, wherein the first doped region and the fifth doped region are abut to each other and the second doped region and the sixth doped region are abut to each other.

14. The overvoltage protection device of claim 9, wherein the third doped region and the fourth doped region are spaced apart from the first doped region and the second doped region.

15. The overvoltage protection device of claim 9, wherein the first doped region extends into a spacing between the third doped region and the fourth doped region.

16. A method for increasing a shunt current of an overvoltage protection device, comprising the steps of:

generating a first current and a second current in response to a voltage;

generating a third current in response to the first current and the second current;

combining the first current and the third current to generate a combined current; and using the combined current to increase the shunt current by increasing a bias current of a transistor of the overvoltage protection device with the combined current.

17. The method of claim 16, further including the steps of:

generating a fourth current in response to the first current and the second current; and combining the fourth current with the combined current to further increase the shunt current.

* * * * *